(12) United States Patent
Waffenschmidt

(10) Patent No.: US 7,113,066 B2
(45) Date of Patent: Sep. 26, 2006

(54) ELECTRONIC INDUCTIVE AND CAPACITIVE COMPONENT

(75) Inventor: Eberhard Waffenschmidt, Aachen (DE)

(73) Assignee: Koninklijke Philips Electronics, N.V., Eindhoven (NL)

( * ) Notice: Subject to any disclaimer, the term of this patent is extended or adjusted under 35 U.S.C. 154(b) by 204 days.

(21) Appl. No.: 10/482,140

(22) PCT Filed: Jun. 26, 2002

(86) PCT No.: PCT/IB02/02606

§ 371 (c)(1),
(2), (4) Date: Dec. 22, 2003

(87) PCT Pub. No.: WO03/005579

PCT Pub. Date: Jan. 16, 2003

(65) Prior Publication Data

US 2004/0169576 A1 Sep. 2, 2004

(30) Foreign Application Priority Data

Jul. 4, 2001 (EP) .................................. 01116172

(51) Int. Cl.
*H01F 27/28* (2006.01)

(52) U.S. Cl. .................. 336/180; 336/182; 336/83
(58) Field of Classification Search ................ 336/200, 336/223, 232

See application file for complete search history.

(56) References Cited

U.S. PATENT DOCUMENTS

| 5,425,167 | A  | * | 6/1995  | Shiga et al. ............... 29/606  |
| 6,344,784 | B1 | * | 2/2002  | Murata et al. ............... 336/83 |
| 6,414,564 | B1 | * | 7/2002  | Mizoguchi et al. .......... 333/35   |
| 6,529,110 | B1 | * | 3/2003  | Fedeli et al. ............... 336/174 |
| 6,535,093 | B1 | * | 3/2003  | Murata et al. ............... 336/83 |
| 6,653,924 | B1 | * | 11/2003 | Vinciarelli et al. ......... 336/212 |

FOREIGN PATENT DOCUMENTS

JP  04221812 A  *  8/1992

* cited by examiner

*Primary Examiner*—Anh Mai

(57) ABSTRACT

An electronic component with inductive and capacitive properties has a core carrying at least one pair of conducting electrodes. The electrodes are wound round the core alternating along the length of the core providing inductivity to the component. First and second electrodes face each other on opposing surfaces of the core providing capacity to the component. To provide an electronic component with high inductivity and capacity, the core is made of material featuring high dielectric constant and high permeability.

19 Claims, 6 Drawing Sheets

ELECTRONIC INDUCTIVE AND CAPACITIVE COMPONENT

The invention relates to an electronic component with inductive and capacitive properties with a core carrying at least one pair of conducting electrodes, where said electrodes are wound round said core, alternating along the length of said core providing inductivity to said component, and where a first electrode and a second electrode of said electrodes face each other on opposing surfaces of said core providing capacity to said component.

The provision of inductive and capacitive properties within one electronic component (LC-component) is known from JP-11-008456, Hasegawa Hiroyuki. From this document it is known to provide a printing board with inductive and capacitive properties. According to this document, a printed wiring board comprises lead patterns which cross each other via an insulating layer. The lead patterns are placed zigzag between via holes on said printing board. By placing the lead patterns this way, magnetic flux is induced, providing inductive properties to the component. By crossing the lead patterns via an insulating layer, electric energy may be stored, providing capacitive properties to said component. The problem of the solution according to JP-11-008456 is that the capacity as well as the inductivity of the LC-component is low due to a low dielectric constant and a low permeability of said printing board.

According to the above described problem it is an object of the invention to provide an electronic component with high inductivity and capacity. It is a further object of the invention to reduce the size of the LC-component.

To solve the object of the invention, it is proposed that said core is made of one material featuring a high dielectric constant and high permeability. Preferably the dielectric constant and the permeability are greater than 1. Said electrodes are wound spiral like round said core. Along the length of the core, the electrodes alternate with each winding. Preferably said electrodes run parallel on opposing surfaces of said core. This layout provides the component with inductive properties. Furthermore, the electrodes face each other via the core on opposing surfaces of the core. The greater the area the electrodes face each other and the smaller the distance between the electrodes, the higher the capacity of the component. By using a material according to the invention, it is possible to store electric energy and to guide magnetic flux within the same volume. Possible materials may be ferrite materials providing a high dielectric constant and a high permeability. By using only one material, the assembly of LC-components becomes easier, as less process steps are needed. By that, the production cost of LC-components can be reduced. Moreover, by using the capacity between the electrodes systematically, parasitic influences and electromagnetic tolerance may be reduced.

The electrodes may be shaped to increase the area therebetween. The electrodes may be made of conducting material such as aluminium or copper, of metal alloys as well as of a compound of poor conducting, thin, wide material coupled with a well conducting material. The electrodes may for instance be vapour-deposited, electroplated, printed, glued or pressed upon said core.

The component may be configured to reduce the distance between the facing electrodes. By leading the electrodes at least partially parallel along a long axis, the area the electrodes face each other is increased. The electrodes run substantially perpendicular to the longitudinal axis of said core. By using at least three electrodes, multiple capacities are possible. Depending on the sequence of the electrodes along the longitudinal axis of the core, different capacitive circuits are possible.

The component may also be configured to achieve a spiral winding of the electrodes round the core. By crossing the electrodes along a short axis with the core between the electrodes, the area of the electrodes facing each other can be kept large.

A member may be provided to improve inductive properties. Said member is magnetically coupled with said core by connectors or air gaps. The magnetic flux is guided at least partially through said member. Said connector may be composed of material with high permeability as well as non permeable material. Said air gap and said connector can be used to adjust the inductivity of the component. Said member may be composed of a permeable, flexible foil. A first member may guide more magnetic flux than a second member. By providing said at least one member, the inductivity of said component may be influenced. Said electrodes may also be wound round said member. By that, also said member may be used for providing inductive and capacitive properties. The capacity and the inductance may be increased by winding said electrodes also round said member. These may be the same electrodes as wound round said core as well as new electrodes.

To provide the component with transforming properties, a third electrode may be provided. By winding the third electrode around said member or said core, the magnetic flux is enclosed by said third electrodes and a current may be induced in said third electrodes. The first and second electrodes may act as primary coil and said third electrode may act as secondary coil of a transformer. The secondary coil may be wound round a first member guiding some of the magnetic flux of said core. A second member may guide the remaining magnetic flux of said core increasing leakage inductance of said transformer.

High inductivity is achieved with a core being toroidal. That means, that the core is closed along its longitudinal axis, and the magnetic flux is substantially guided within the core.

An insulator is provided between said electrodes. The insulator insulates the electrodes from each other. The insulator may also insulate the electrodes from the core and/or the member to prevent leakage currents. In case a primary coil and a secondary coil are provided for transforming properties, the insulator provides galvanic decoupling of said coils. The insulator may be synthetic material or any other insulating material. Also the insulator may be a non-conducting foil.

Air gaps may also be provided in or in between said core and/or said member. These air gaps may as well be filled with material with different permeability and dielectric constant than that of the core and/or the member. By providing air gaps, the inductivity and capacity may be influenced.

Different capacitive circuits are possible according to claim 10. One electrode may be twice as wide as the remaining two electrodes. In such a case, this electrode may act as centre electrode. In that case a star connection of capacitors can be created.

These and other aspects of the invention will be apparent from and elucidated with reference to the embodiments described hereinafter. In the figures:

FIGS. 1a–e show an LC-component layout;
FIGS. 2a–d show circuit variations;
FIG. 3 shows a second LC-component layout;
FIG. 4 shows a multi-capacity layout;

Figure 7A:
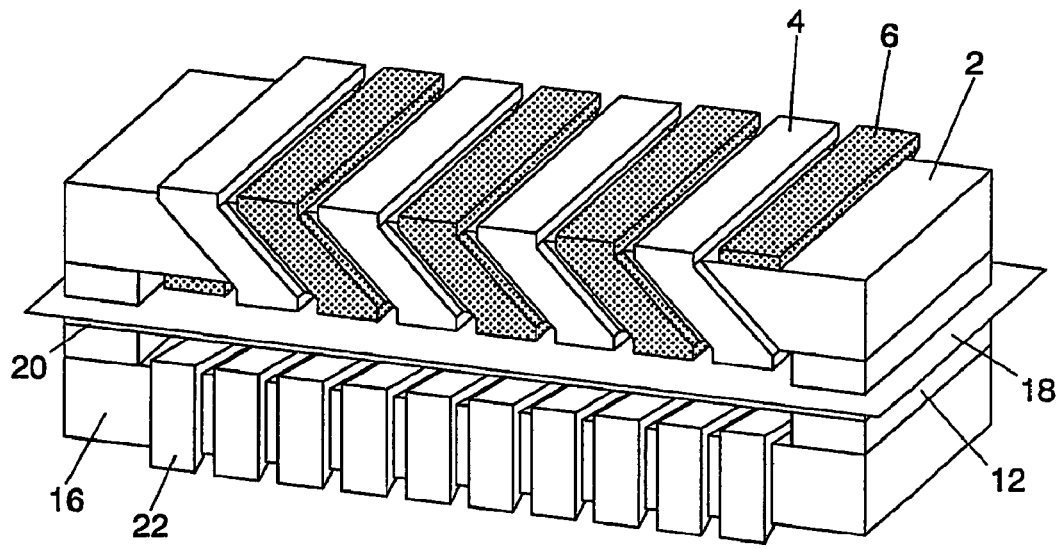
Figure 7B:
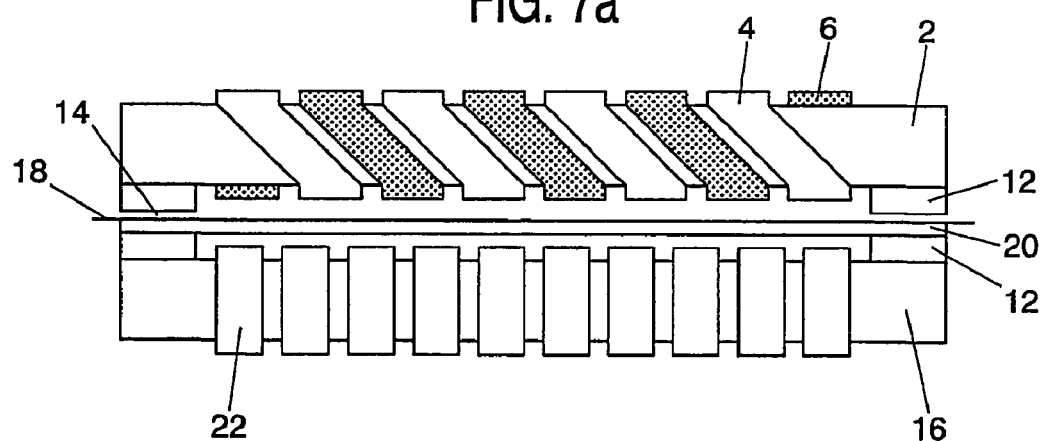
Figure 7C:

FIGS. 7a–c show a component with transformer properties.

Figure 1A:
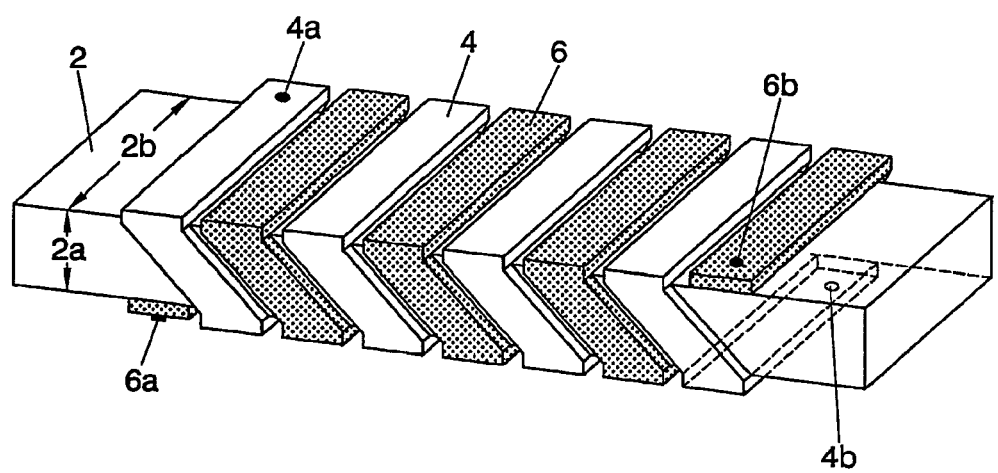

FIGS. 1a–2 depict one embodiment of a component according to the invention. In figure 1a a perspective view on such a component is shown. A core 2, conducting electrodes 4 and 6 as well as electric connectors 4a, b and 6a, b are depicted. Said core 2 features high permeability and a high dielectric constant. Around said core 2 said electrodes 4 and 6 are wound. Along a long axis 2b of said core 2, said electrodes run parallel on opposing surfaces of said core 2. Along a short axis 2a of said core 2 said electrodes cross each other on opposing sides of said core 2.

Figure 1B:
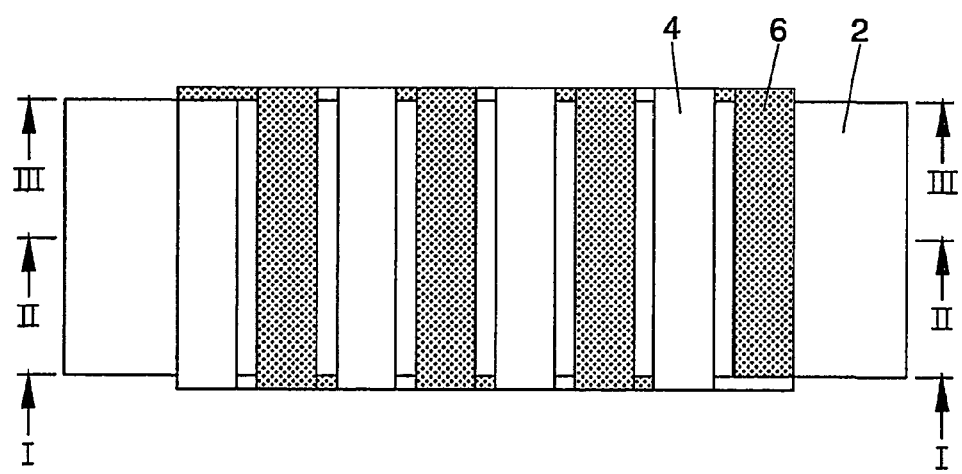

FIG. 1b depicts a plan view of the component shown in FIG. 1a. It can be seen that along the long axis 2b said electrodes 4, 6 run parallel creating a large area for capacitive properties of said component.

Figure 1C:
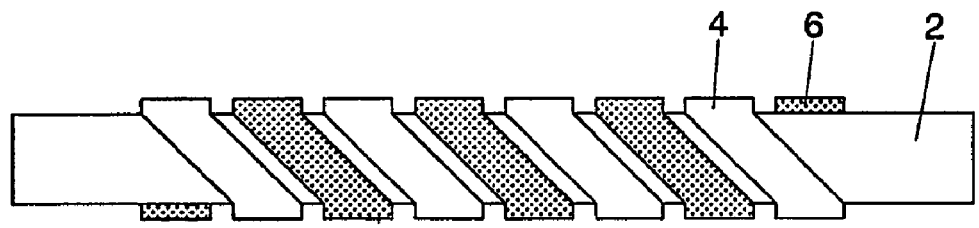
Figure 1D:
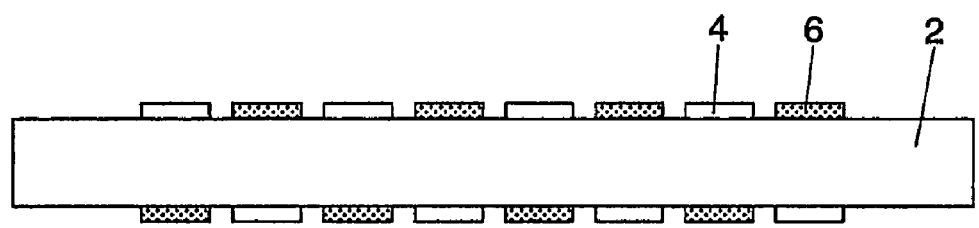
Figure 1E:
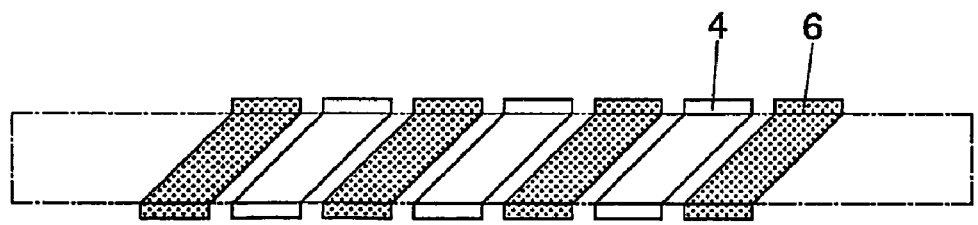

FIG. 1c shows a side view of said component along section I. Comparing FIG. 1c with FIG. 1e, which shows a side view of said component along section III, it can be seen that said electrodes 4, 6 cross each other on opposing surfaces of said core 2. In FIG. 1d, which is a side view along section II, it can be seen, that said electrodes 4, 6 face each other on opposing surfaces of said core 2. Vis-à-vis electrode 4, electrode 6 is placed on the opposing surface of said core 2, thus creating a large area for the capacity of said component.

Figure 2A:
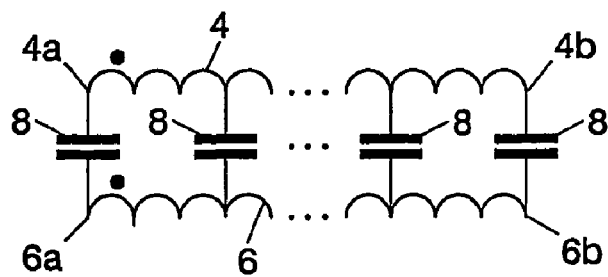

FIGS. 2a–d show different wirings of the component according to the invention. In FIG. 2a the circuit diagram of the component shown in figure 1 is depicted. The corresponding schematic view of electrodes 4, 6, electric connectors 4a, b and 6a, b, and a capacity 8 are shown. Said capacity 8 derives from the electrodes 4, 6 facing each other on opposing surfaces of said core. The electrodes 4, 6 themselves feature inductive properties, as they are wound spiral like round said core 2.

Figure 2B:
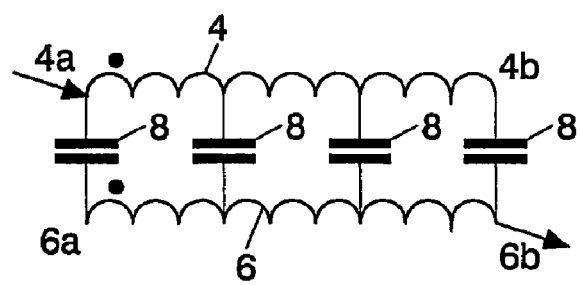

By using electric connectors 4a and 6a, as shown in FIG. 2b, a serial connection of a capacitor 8 and an inductance 4, 6 is possible.

Figure 2C:
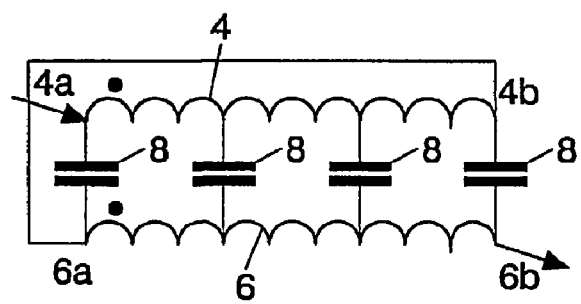

By using connector 4a and 6b according to FIG. 2c, a parallel connection of a capacitor a and an inductance 4, 6 is achieved.

Figure 2D:
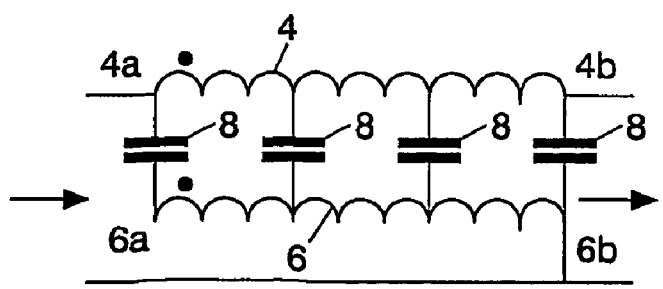

A lowpass filter is possible when wiring the component according to FIG. 2d. Further wirings are possible and within the scope of the invention.

Figure 3:
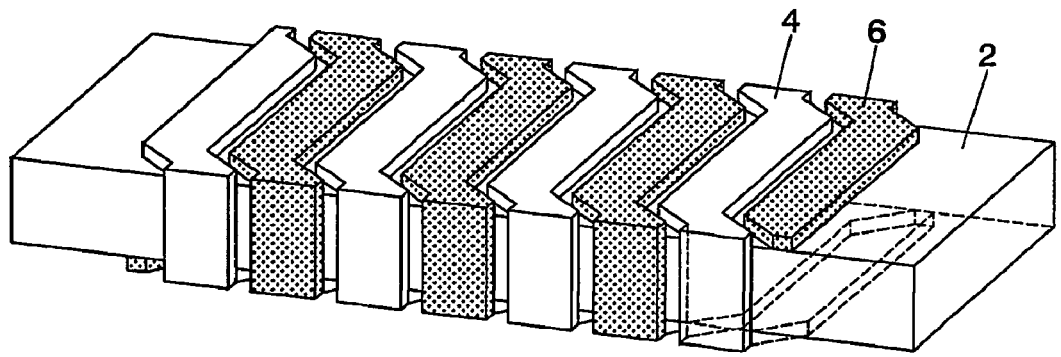

By crossing said electrodes 4, 6 on opposing surfaces of said core 2 as shown in FIG. 3, the electrodes are parallel along said short axis 2a By that said electrodes 4, 6 may be easier applied to said core 2 during the assembly process. The capacity is decreased in comparison to a component according to FIG. 1 as the area of the electrodes facing each other along the long axis of the core is reduced.

Figure 4A:
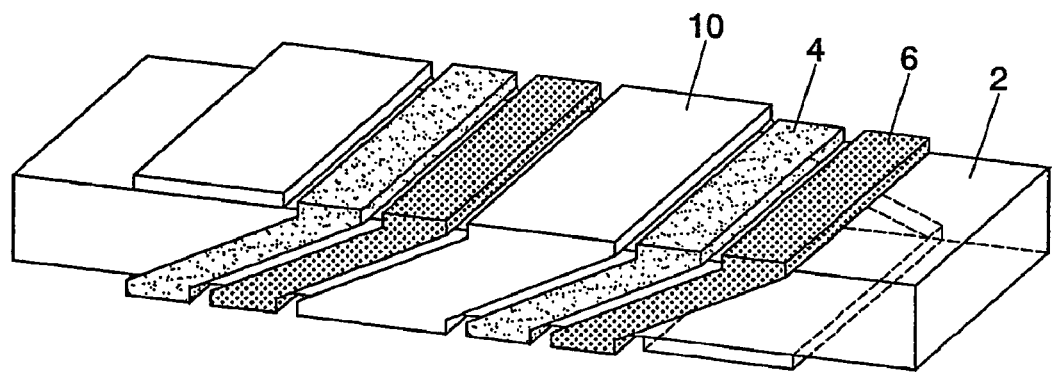
Figure 4B:
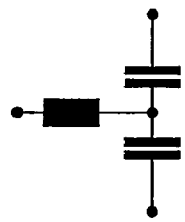

FIG. 4a depicts a multi-capacitor layout. Around said core 2, said electrodes 4, and 6 as well as electrode 10 are wound spiral like. The width of electrode 10 is substantially larger than the width of said electrodes 4 and 6. By that, the area occupied by electrode 10 is vis-à-vis the area occupied by electrodes 4 and 6. As a result, electrodes 10 serves as capacitor electrode for electrode 4 as well as electrode 6. The corresponding star connection is depicted in FIG. 4b. It is further possible that said electrodes 4, 6, and 10 have equal widths. By arranging the electrodes along the long axis of said core in certain sequences, different star- or triangle circuits are possible.

Figure 5:
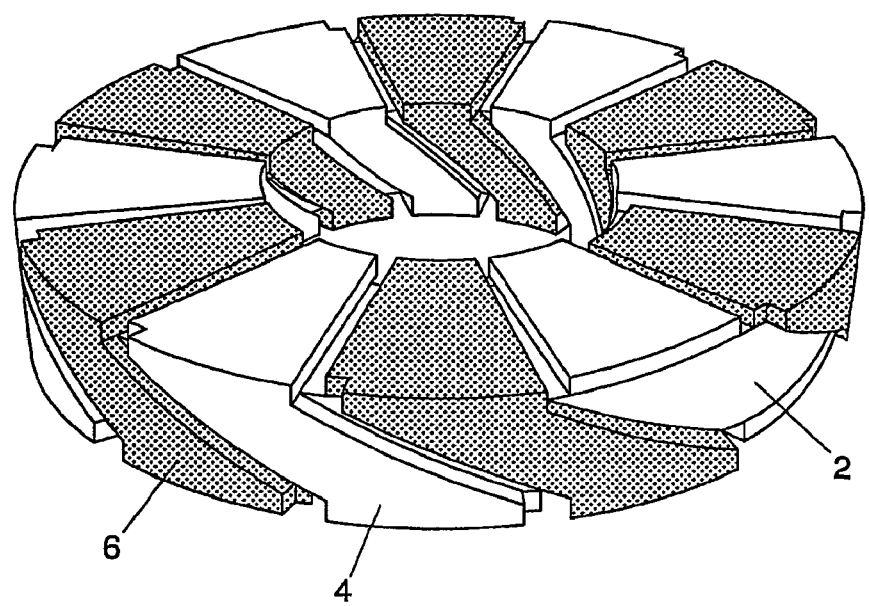
FIG. 5 shows a toroidal core.

FIG. 5 depicts a LC-component with a closed magnetic circuit. Said core 2 is a toroidal core with said electrodes 4, 6 wound around said core 2. By closing the magnetic circuit, the magnetic flux is guided substantially within said core 2 and the inductance of said component is increased.

Figure 6:
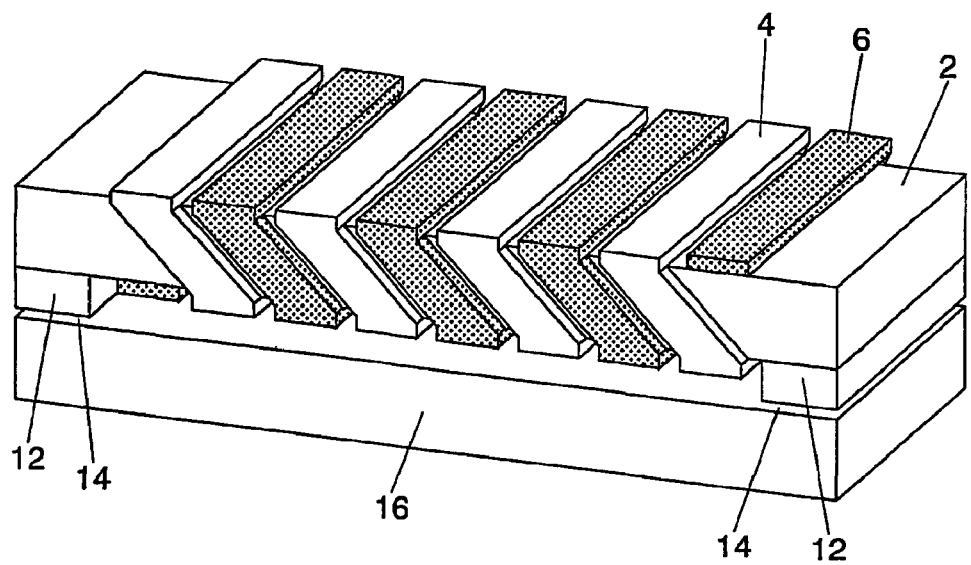
FIG. 6 shows a closed magnetic circuit.

FIG. 6 depicts a further embodiment with a closed magnetic circuit. Said electrodes 4, 6 are wound round said core 2 in the same way as depicted in FIG. 1. Further coupler 12 and a coupling member 16 are provided. The magnetic flux induced in said core 2 by said electrodes 4 and 6 is guided via said coupler 12 to said coupling member 16. Said coupling member 16 closes the magnetic circuit of the shown component and thus increases the inductance of said component. The inductance may be adjusted by air gaps 14. These air gaps 14 are positioned within the magnetic circuit and allow to adjust the inductance of said component. Said electrodes 4, 6 may also be wound round said coupling member 16. It is also possible that further electrodes are wound round said coupling member 16. By that, the capacity and inductance of said component may be adjusted.

To provide transforming properties to the component, an embodiment according to FIGS. 7a–c is preferred. In addition to figure 6, an insulating layer 18, a second member 20, which is a leakage layer, and a secondary coil 22 are provided. The magnetic flux induced in said core 2 by said electrodes 4 and 6 is guided to coupling member 16 by said coupler 12. The magnetic flux is also partially guided through said second member 20. Second member 20 may be a permeable foil. By guiding some of the magnetic flux through said second member 20, the leakage inductivity of said component may be increased. The rest of said magnetic flux is guided through said coupling member 16, thus in said secondary coil 22 a current may be induced. Said secondary coil 22 provides transforming properties. The second member 20 may be omitted. In this case the whale magnetic flux is guided through said coupling member 16. Said insulating layer 18, which can also be omitted, provides galvanic insulation between said electrodes 4 and 6 serving as primary coils and said secondary coil 22.

Said secondary coil 22 may also be wound around said core 2, thus reducing the size of said component. It is further possible, that said secondary coil 22 is wound round said core 2 as well as said coupling member 16, thus increasing inductance of said component.

FIG. 7c shows representing circuits for a component shown in FIG. 7a, b.

By using one material with high permeability and a high dielectric constant, the size of an LC component can be kept small. The electrode arrangement according to the invention also provides high capacity and inductance.

The invention of claimed is:

1. An electronic component with inductive and capacitive properties with
   a core carrying at least one pair of conducting electrodes,
   wherein said at least one pair of conducting electrodes are wound round said core alternating along the length of said core and running substantially parallel to each other providing inductivity to said component,
   wherein a first electrode and a second electrode of said at least one pair of conducting electrodes face each other on opposing surfaces of said core providing capacity to said component,
   wherein said core is made of one material featuring a high dielectric constant and high permeability,
   wherein said core has a cross-sectional area circumscribed by a rectangle, said rectangle having a short axis and a long axis, and wherein said at least one pair of conducting electrodes cross each other along said short axis on opposing surfaces of said core.

2. The electronic component according to claim 1, wherein said at least one pair of conducting electrodes are flat-shaped.

3. The electronic component according to claim 1, wherein said core is flat-shaped, and
wherein said at least one pair of conducting electrodes run at least partially parallel along said long axis on opposing surfaces of said core.

4. The electronic component according to claim 1, further comprising at least one member being at least of the same length as said core, wherein said member is magnetically coupled to said core, guiding at least partially the magnetic flux of said core.

5. The electronic component according to claim 1, further comprising at least a third conducting electrode wound round a member and/or said core carrying magnetic flux provided by said first and second electrodes.

6. The electronic component according to claim 1, wherein said core is a toroidal core.

7. The electronic component according to claim 1, further comprising an insulator insulating said at least one pair of conducting electrodes from each other and/or from said core.

8. The electronic component according to claim 1, wherein at least one air gap in or in between said core and/or a member is provided.

9. The electronic component according to claim 1, wherein a third electrode of said at least one pair of conducting electrodes has a cross-sectional area that differs from the cross-sectional areas of the first electrode and the second electrode.

10. An electronic component comprising:
a first electrode;
a second electrode; and
a core located between said first electrode and said second electrode, said core having a dielectric constant and permeability which are greater than 1;
said first electrode and said second electrode being wound round said core alternating along a length of said core, running substantially parallel to each other and facing each other on opposing surfaces of said core;
wherein said first electrode and said second electrode electrodes cross each other along a thickness of said core.

11. The electronic component according to claim 10, wherein at least one of said first electrode and said second electrode is flat-shaped.

12. The electronic component according to claim 10, wherein said core is flat-shaped, and wherein said first electrode and said second electrode run at least partially parallel along said length on opposing surfaces of said core.

13. The electronic component according to claim 10, further comprising at least one member having substantially a same length as said length of said core, wherein said member is magnetically coupled to said core.

14. The electronic component according to claim 10, further comprising a third electrode wound round said core.

15. The electronic component according to claim 10, wherein said core is a toroidal core.

16. The electronic component according to claim 10, further comprising an insulator insulating said first electrode and said second electrode.

17. The electronic component according to claim 10, further comprising an insulator insulating said core.

18. The electronic component according to claim 10, wherein at least one air gap in or in between said core is provided.

19. The electronic component according to claim 10, further comprising a third electrode which has a cross-sectional area that differs from cross-sectional areas of said first electrode and said second electrode.

* * * * *